(12) United States Patent
Lu et al.

(10) Patent No.: US 6,297,720 B1
(45) Date of Patent: *Oct. 2, 2001

(54) ELECTRONIC SURFACE MOUNT PACKAGE

(75) Inventors: Peter Lu, Flower Mound, TX (US); Jeffrey Heaton, Cupertino; James W. Heaton, Los Altos, both of CA (US); Tsang Kei Sun, Kowloon (HK); Peter Loh Hang Pao, Kowloon (HK); Robert Loke Hang Lam, Kowloon (HK)

(73) Assignee: Halo Electronics, Inc., Redwood City, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/773,555

(22) Filed: Dec. 27, 1996

Related U.S. Application Data

(63) Continuation-in-part of application No. 08/513,573, filed on Aug. 10, 1995, now Pat. No. 5,656,985.

(51) Int. Cl.[7] ............................. H01F 27/02; H01F 27/209
(52) U.S. Cl. ............................. 336/96; 336/192; 336/229; 336/90
(58) Field of Search ................................. 336/229, 192, 336/65, 90, 96; 174/52.4; 361/821

(56) References Cited

U.S. PATENT DOCUMENTS

| | | | |
|---|---|---|---|
| 3,721,747 | * 3/1973 | Renskers | 336/96 |
| 4,205,291 | 5/1980 | Flentge | 336/92 |
| 5,034,854 | 7/1991 | Matsumura et al. | 361/396 |
| 5,307,041 | 4/1994 | Kato et al. | 336/83 |

FOREIGN PATENT DOCUMENTS

| | | | |
|---|---|---|---|
| 0 490 438 A1 | 6/1992 | (EP) | H01F/31/00 |
| 38-20060 | 9/1963 | (JP) | 336/229 |
| 5-275253 | 10/1993 | (JP) | 336/229 |

OTHER PUBLICATIONS

McCormick; Surface Mount Transformers: A New Packaging Approach; Surface Mount Technology; Feb. 1993; pp. 27–31.

Wyns et al.; PSPICE Simulations and 3D–PCB Transformers for ZVS Full Bridge Converters; The European Power Electronics Association; 1993; pp. 208–214.

EPE'93 Fifth European Conference; Power Electronics and Applications; vol. 3: Electronic Power Supply System; Sep. 13–16, 1993; pp. 215.

Davis; SMT Passive Components Fit Power Electronics Applications; PCIM; Jun. 1993; vol. 19; No. 6; pp. 20–28 and 90.

(List continued on next page.)

*Primary Examiner*—Anh Mai
(74) *Attorney, Agent, or Firm*—Trial & Technology Law Group

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking. A reinforcement beam is located laterally across the bottom of the package to provide mechanical strength for the case.

8 Claims, 6 Drawing Sheets

OTHER PUBLICATIONS

Osawa; A Superminiaturized Double–Balanced SMT Mixer–Modulator; Microwave Journal; Feb. 1994; pp. 90–97.

Lyons et al.; Printed Circuit Board Magnetics: A New Approach to the Mass Production of Toroidal Transformers; ISHM '95 Proceedings; pp. 53–58.

Derebail et al.; Knowledge Based Adhesive Selection for SMT Assemblies; Proceedings 1995 International Symposium on Microelectronics; Oct. 24–26, 1995; vol. 2649; pp. 1024–1035.

* cited by examiner

ELECTRONIC SURFACE MOUNT PACKAGE

CROSS REFERENCE TO RELATED APPLICATIONS

The present application is a continuation-in-part of application entitled ELECTRONIC SURFACE MOUNT PACKAGE, Ser. No. 08/513,573, filed Aug. 10, 1995 now U.S. Pat. No. 5,656,985, issued Aug. 12, 1997 and assigned to the same Assignee as the present application.

BACKGROUND OF THE INVENTION

The present invention relates to an electronic surface mount package or case. Electronic surface mount packages are utilized in applications in which one or more individual toroid transformers are embodied within the surface mount package.

Wires coming off the transformers are electronically tied to pins on the package for connection to an electronic device. Typically, the electronic surface mount packages are mounted on a printed circuit board for utilization in the electronic device.

It is widely known in the local area magnetic industry that when surface mount toroidal magnetics which are encapsulated in hard plastics go through infra-red soldering processes, the magnetic components (ferrite) can expand significantly. When using a hard epoxy type material, it has been found that the magnetic component expansion can often cause cracking of the package or case, which makes the part unusable. In view of the foregoing, it would be highly desirable to provide an improved electronic surface mount package which avoids the cracking and expansion problems described above.

SUMMARY OF THE INVENTION

It is an object of the present invention to provide an improved electronic surface mount package.

Briefly, according to one preferred embodiment, the present invention provides a one piece construction package (with an open bottom) with one or more terminal pins molded into the package. Each of the pins have a notched post upon which a wire is wound and soldered. The wire which is wound and soldered around each terminal pin/post is from a respective toroid transformer carried within the package. Each of the posts are notched so that the respective wires are separated from one another so as to avoid arcing. The case is open at the bottom which prevents cracking and allows for the toroidal expansion. The present invention also includes a reinforcement beam that is disposed laterally or sidewise across the bottom of the package to provide extra support in the mechanical strength of the case.

Other objects, features, and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE DRAWINGS

Reference will now be made in detail to the preferred embodiments of the invention, examples of which are illustrated in the accompanying drawings, where like numerals indicate like components. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

As will be described in more detail below, the present invention is directed toward applications for packages mounted on a printed circuit board in an electronic device, which requires very low current and voltages, and is for DC voltages only. The present invention provides for a low power application in which the package includes one or more toroidal transformers which are carried or supported by a soft silicone material within an open construction package and which utilizes a portion of the case as a standoff to ensure that the pin-posts do not touch a PCB when mounted by a user.

As described above, it is known that when the parts go through an infra-red soldering process, the magnetic components (ferrite toroids) can expand significantly. When using a hard epoxy type material, it has been found that the magnetic component expansion can often cause cracking of the package or case, which is highly undesirable. The present invention solves this problem by providing an open design within which is placed a soft silicone material which allows for expansion during the soldering process, rather than trying to contain the components within a closed case or package. Hence, with the open construction, the present invention has no bottom at all. In addition, the magnetic components are not mounted on anything but rather are encapsulated or supported ("carried by a soft silicone material"). The wires from the toroids are wound around and soldered to the pin-posts. This construction solves the cracking and expansion problems described above, as will now be described in conjunction with FIGS. 1–11.

Figure 1:
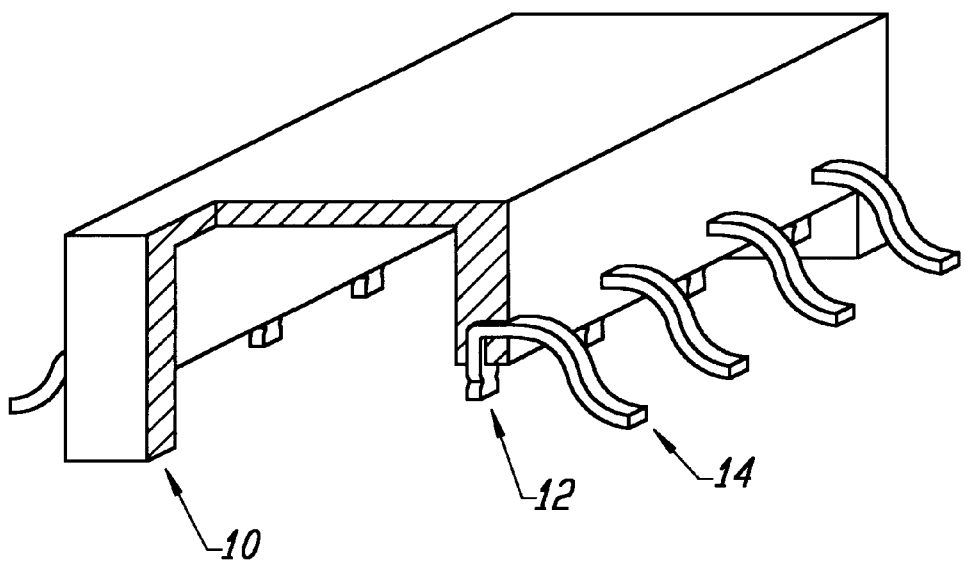
FIG. 1 shows an electronic surface mount package in three-dimensional view according to the present invention.

FIG. 1 shows an electronic surface mount transformer package or case 10 in three-dimensional view. FIG. 1 shows a cut-away of the empty case 10 with pins 14 molded into the case 10, together a the notched post 12 upon which a wire is wound. Post 12 has an hour-glass shape which facilitates the winding of wire around post 12, as will be described. Typically, tin-lead plated copper alloy terminals are molded into the wall of the package 10. The outer portion of the package 10 is formed to meet specified footing requirements. The inner post 12 serves as a terminal for internal wire termination use. The package material is made of type of thermal plastic which is in compliance with UL V-94 requirement for flammability.

Figure 2:
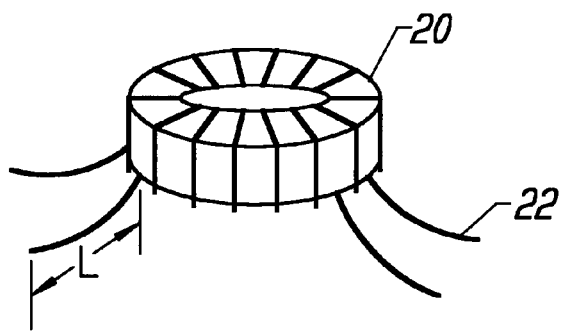
FIG. 2 shows a wound toroid transformer.

FIG. 2 shows a wound toroid transformer 20 with wire 22 wrapped around the transformer 20. The toroid core is typically made of ferrite material and the winding of wire 22 is done manually with fine insulated magnet wire.

Figure 3:
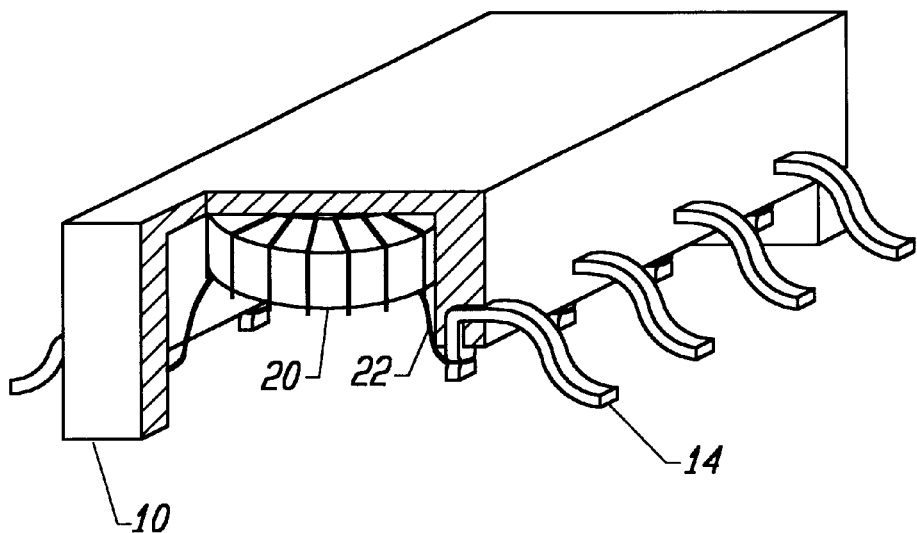
FIG. 3 shows the connection of the toroid transformer of FIG. 2 within the electronic surface mount package of FIG. 1.

FIG. 3 shows a cut-away of the molded part with the toroid 20 mounted inside and showing the wire 22 as it is then attached to post 14. The wires 22 are pulled with minimum tension and wrapped around the terminal post 14 for two to two and a half turns. This operation is done when the case has been placed bottom side up.

Figure 4:
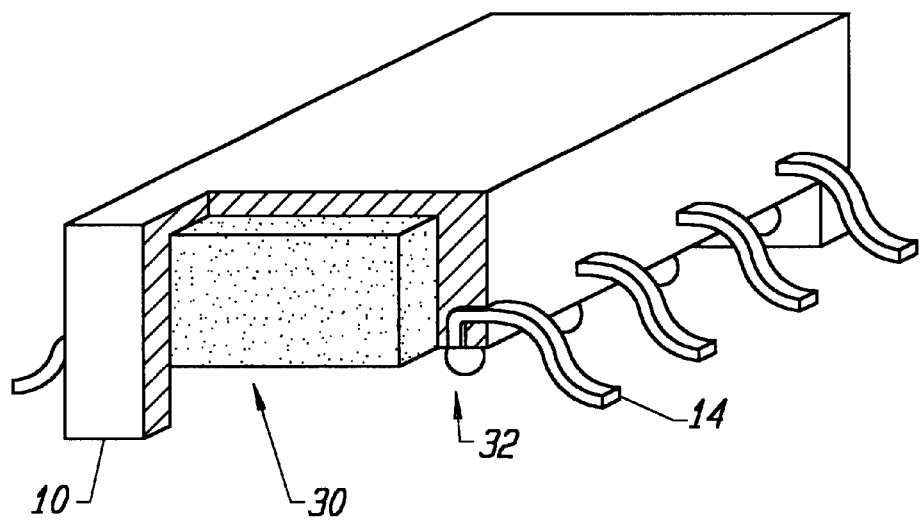
FIG. 4 shows the electronic surface mount package of FIG. 1 after wire terminations have been soldered.

FIG. 4 shows a silicone compound 30 poured inside the cavity with wire terminations that have been soldered with high temperature solder (95 Ag/5Sn) 32 and the package has been properly cleaned. The case 10 is then filled with soft silicone material (preferably a soft epoxy type material) to protect the transformer and to meet environmental requirements.

Figure 5:
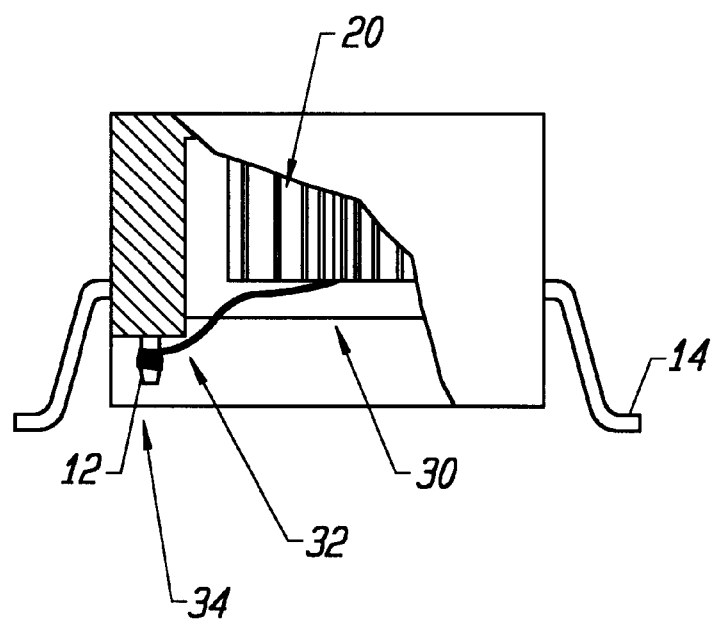
FIG. 5 and 6 show relationships between a safeguard (standoff) and the electronic surface-mount package's foot seating plane and inner terminal posts, respectively.
Figure 6:
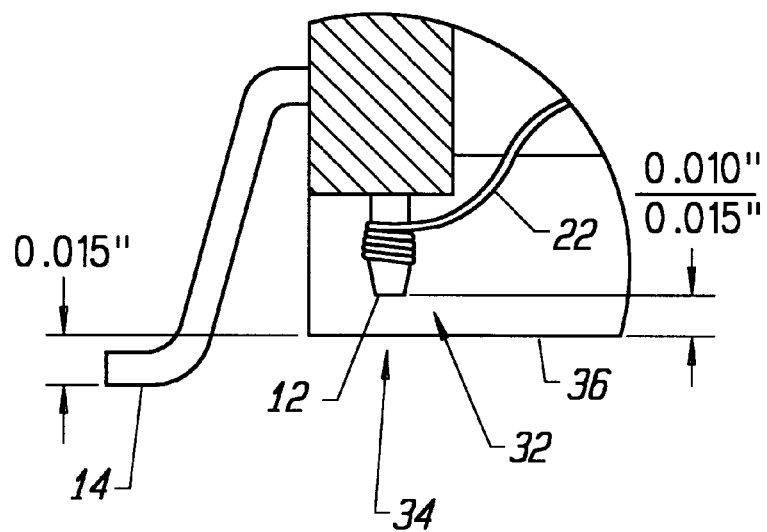

FIGS. 5 and 6 show the relationships between the safe guard (stand off) 34 and package's foot seating plane and inner terminal posts 12a. FIG. 5 shows the standoff 34, in which the parts typically are placed automatically by machine onto a PC board. They are pressed down, as it is desirable to have some limitation of how far they can be pressed. It is also desirable that the post 12 does not touch the PC board, and so the end standoffs 34 do not allow that to happen. In a preferred embodiment, post 12 is oriented substantially perpendicular to, but does not touch, PC board.

FIG. 6 shows the distance in relationship between the end of the post 12 and where the PC board 36 is located and also where the standoff 34 ends. The PC board 36 would be at the base of the foot.

In FIG. 6, the typical clearance of 0.015 inches from the safe guard 34 to the seating plane is to avoid interference to the coplanarity of the package. There is also a gap between the safe guard 34 and terminal post 12 to prevent the solder joints from touching the circuit board due to an over forced pick and place operation.

Inside the package 10, there may be two, three, or more individual toroidal transformers. Wires coming off of the transformers are connected to the outside world. For example, the pins may be mounted on a printed circuit board in an electronic device. The leaf frame pins are injection molded into the body and which allows for an exposed notched post upon which the wire is wound from the toroidal transformer. This allows for the wires to be separated from pin to pin, and for soldering to be much more efficient.

Figure 7:
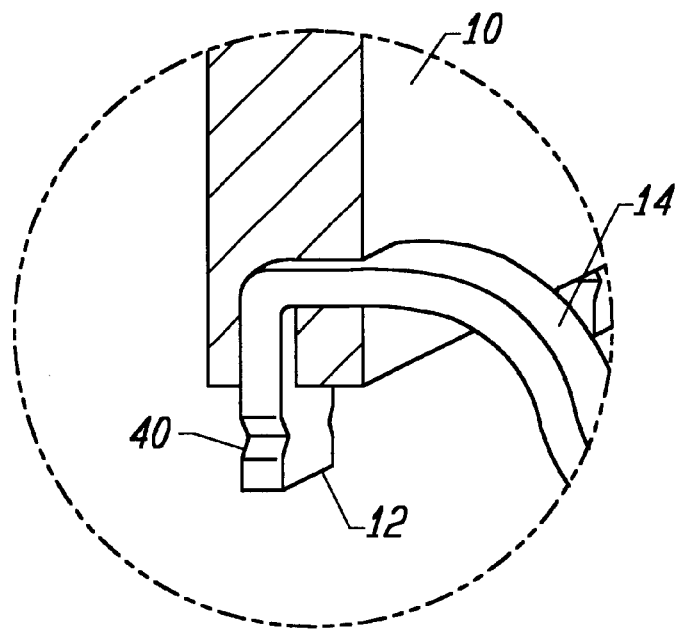
FIG. 7 shows a close-up of the pin configuration of FIG. 1 and how it is molded inside the wall of the body of the package.

FIG. 7 shows a closeup of the hour-glass shaped pin 12 and how pin 12 is molded inside the wall of the body and also the notch effect 40 of the pin 12. The post 14 is notched so that the wires are kept away from another, post to post, which is very desirable. The separation is desirable so as to avoid arcing.

Figure 8:
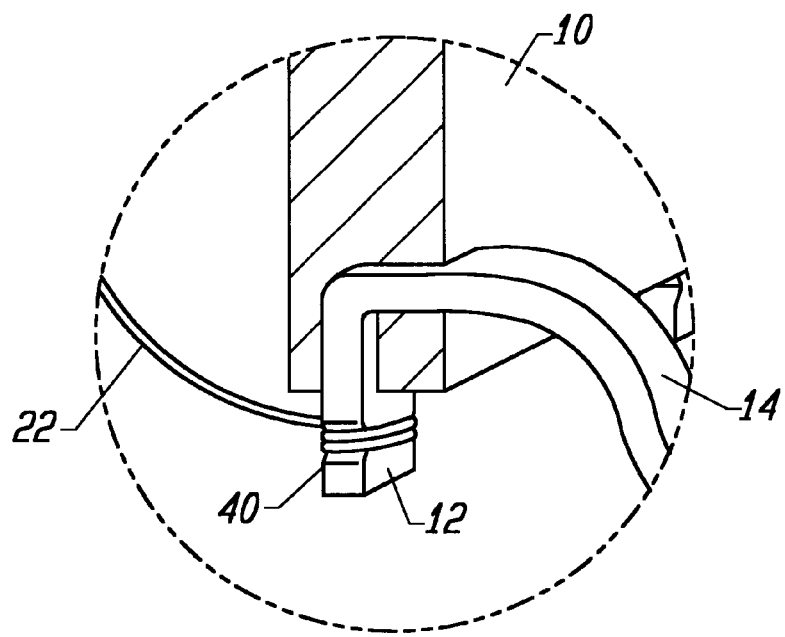
FIG. 8 shows wire wrapped around the pin or post of FIG. 7.
Figure 9B:
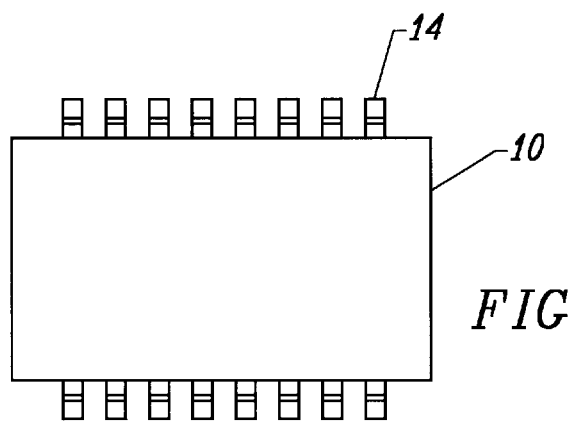
FIGS. 9A–9D show end, top, side, and bottom views of electronic surface mount package according to the present invention.
Figure 9A:
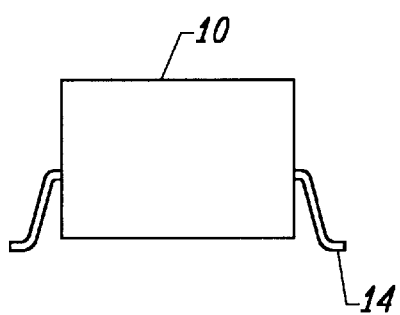
Figure 9C:
Figure 9D:
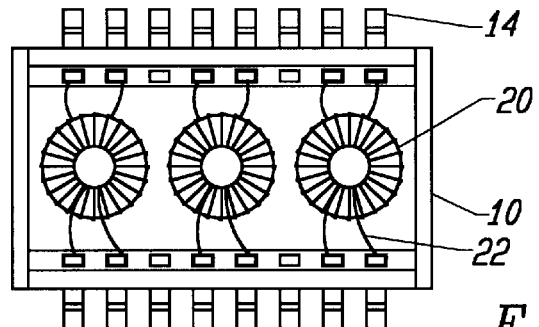

FIG. 8 shows the wire 22 wrapped around the pin or post 12.

FIGS. 9A–9D show end, top, side, and bottom views, respectively, of the electronic surface mount package 10. The embodiment shown in FIGS. 9A–9D provide an industrial standard surface mount footprint and package dimensions which are auto pick and placeable. In addition, special design consideration has been applied to thermal expansion of materials to ensure that the package will stand all normal re-flow processes with low cost, easy manufacturing, and high reliability.

In the industry, most manufacturers have used a two-piece construction, a base and a cover, and the case is backfilled with hard epoxy. In some processes, the coefficients of expansion of the epoxy that has been backfilled tends to cause the two pieces to separate. The base separates from the top, and as a result, can end up cracking. The present invention provides a one-piece open construction (an open bottom) only with the soft silicone filling to protect the toroid. The case is open at the bottom, thus allowing the toroids to expand naturally without cracking the body of the part.

Figure 10:
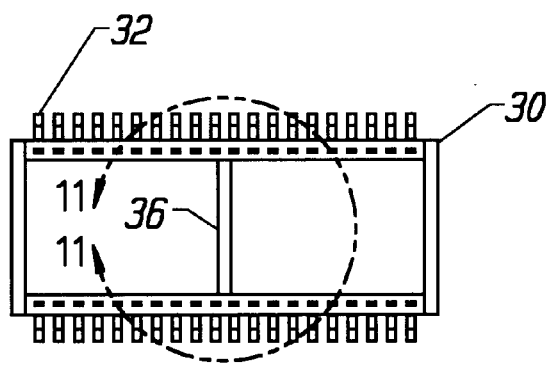
FIG. 10 shows a bottom view of a 40 pin package according to the present invention.

FIG. 10 shows a bottom view of a 40 pin package 30 which includes pins 32 which includes a reinforcement beam 36 laterally disposed across the bottom of the case or package 30 reinforcement beam 36 provides extra support for improving the mechanical strength of the package 30.

Figure 11:
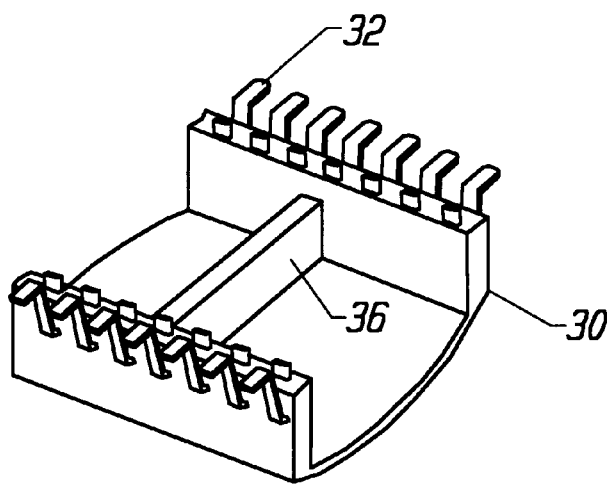
FIG. 11 shows an enlarged sectional view of FIG. 10 illustrating a reinforcement beam.

FIG. 11 shows an enlarged sectional view of the package 30 of FIG. 10 in which the reinforcement beam 36 is disposed laterally or sidewise across the bottom of the package or case 30. The 40 pin surface mount package shown in FIGS. 10 and 11 include the reinforcement beam 36 which provides extra support to the mechanical strength of the package 30. This provides for an improved mechanically stable package 30 which when undergoing an IR (infrared) re-flow process and also maintain the coplanarity of the leads or pins 32 shown in FIG. 11.

Although FIG. 11 shows one reinforcement beam 36 laterally disposed across the bottom of the case or package 30, it would be apparent to one of ordinary skill in the art that additional reinforcement beams can be located on the bottom of the case or package 30 as the situation warrants.

It should become apparent that various desirable features of the present invention have been shown and described. In the present invention, the pin termination is not flush mounted but rather extends from the bottom of the package. Further, the termination is wound and soldered to the extended pin-post assembly, as shown in FIGS. 1 and 3–8. The use of a soft silicone material (such as soft epoxy) to carry the toroid transformers within the case or package acts to encapsulate or support the toroid transformer within the case or package.

The present invention is directed toward applications for packages mounted on a printed circuit board in an electronic device, which requires very low current and voltages, and is for DC voltages only. The present invention provides for a low power application in which the package includes one or more toroidal transformers which are carried or supported by a soft silicone material within an open construction package and which utilizes a portion of the case as a standoff to ensure that the pin-posts do not touch a PCB when mounted by a user.

It is widely known that when the toroidal magnetics are mounted in hard plastic packages, the infra-red soldering processes cause the magnetic components (ferrite) to expand significantly. When using a hard epoxy type material, it has been found that the magnetic component expansion can often cause cracking of the package or case, which is highly undesirable. The present invention solves this problem by providing an open design within which is placed a soft silicone material which allows for expansion during the soldering process, rather than contain the components within a closed case or package. Hence, with the open construction, the present invention has no bottom at all. In addition, the magnetic components are not mounted on anything but rather are encapsulated or supported ("carried by a soft silicone material") such that when the wires are wound around and soldered to the pin-posts, the cracking and expansion problems described above are avoided.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electronic surface mount package for mounting onto the surface of a printed circuit board in an electronic device, said package comprising:

a one piece open construction package having a side wall, a plurality of toroid transformers within said package, said toroid transformers each having wires wound thereon, a plurality of terminal pins molded within the side wall of said package, the ends of the terminal pins forming solder posts and extending through and below the bottom of said side wall, said solder posts each having an hour-glass shaped notch upon which said wires from said transformers are wrapped and soldered thereon, respectively, the other end of each of the terminal pins extending in gull wing fashion outwardly from the side wall and below the bottom of the package for mounting onto the surface of the printed circuit board.

2. An electronic surface mount package for mounting onto the surface of a printed circuit board comprising:

a one piece open construction package having a side wall, a plurality of toroid transformers within said package in a soft silicone material, said toroid transformers each having wires wound thereon, a plurality of terminal pins molded within the side wall of said package, the ends of the terminal pins forming solder posts extending through and below the bottom of said side wall, said solder posts each having a notched post upon which said wires from said transformers are wrapped and soldered thereon, respectively, the other end of each of the terminal pins extending outwardly from the side wall and below the bottom of the package for mounting onto the surface of the printed circuit board.

3. An electronic surface mount package for mounting onto the surface of a printed circuit board comprising:

a construction package having a side wall and an open bottom, a plurality of toroid transformers within said package in a soft silicone material, said toroid transformers each having wires wound thereon, a plurality of terminal pins molded within the side wall of said package, the ends of the pins forming solder posts extending through and below the bottom of said side wall, said solder posts each having a notched post upon which said wires from said transformers are wrapped and soldered thereon, respectively.

4. An electronic surface mount package for mounting onto the surface of a printed circuit board in an electronic device, said electronic surface mount package comprising:

a one piece open construction package having a side wall, a plurality of toroid transformers within said package in a soft silicone material, said toroid transformers each having wires wound thereon, a plurality of terminal pins molded within the side wall of said package, the ends molded pins forming solder posts extending through and below the bottom of said side wall, said solder posts each having a notched post upon which said wires from said transformers are wrapped and soldered thereon, respectively.

5. The package as in claim 4 further including a standoff for maintaining a distance between the bottom of said pins and said printed circuit board.

6. An electronic surface mount package for mounting onto the surface of a printed circuit board comprising:

an open construction package having a side wall, at least one toroid transformer within said package in a soft silicone material, said toroid transformer having a wire wound thereon, at least one terminal pin molded within the side wall of said package, said one end forming a solder post extending through and below the bottom of said side wall said solder post having a notched post upon which said wire from said transformer is wrapped and soldered thereon.

7. The package as in claim 6 wherein the package includes an end wall to form a safe guard and wherein said one end of said terminal pin extends below the bottom of the side wall but does not extend below the safe guard.

8. The package as in claim 7 wherein the terminal pin has another end which extends in wing like fashion through the other side of the side wall below the bottom of the package to form a surface mounting portion for mounting on the surface of the printed circuit board.

* * * * *

UNITED STATES PATENT AND TRADEMARK OFFICE
CERTIFICATE OF CORRECTION

PATENT NO. : 6,297,720 C1
APPLICATION NO. : 90/009139
DATED : December 22, 2009
INVENTOR(S) : Peter Lu et al.

It is certified that error appears in the above-identified patent and that said Letters Patent is hereby corrected as shown below:

Column 2, line 29 (Claim 14), please delete "said wall" and insert --side wall--.

Signed and Sealed this

Eighth Day of June, 2010

David J. Kappos
*Director of the United States Patent and Trademark Office*

(12) EX PARTE REEXAMINATION CERTIFICATE (7254th)

United States Patent
Lu et al.

(10) Number: US 6,297,720 C1
(45) Certificate Issued: *Dec. 22, 2009

(54) ELECTRONIC SURFACE MOUNT PACKAGE

(75) Inventors: Peter Lu, Flower Mound, TX (US);
Jeffrey Heaton, Cupertino, CA (US);
James W. Heaton, Los Altos, CA (US);
Tsang Kei Sun, Kowloon (HK); Peter Loh Hang Pao, Kowloon (HK); Robert Loke Hang Lam, Kowloon (HK)

(73) Assignee: Halo Electronics, Inc., Redwood City, CA (US)

Reexamination Request:
No. 90/009,139, May 5, 2008

Reexamination Certificate for:
Patent No.: 6,297,720
Issued: Oct. 2, 2001
Appl. No.: 08/773,555
Filed: Dec. 27, 1996

( * ) Notice: This patent is subject to a terminal disclaimer.

Related U.S. Application Data

(63) Continuation-in-part of application No. 08/513,573, filed on Aug. 10, 1995, now Pat. No. 5,656,985.

(51) Int. Cl.
*H01F 27/02* (2006.01)
*H01F 27/209* (2006.01)

(52) U.S. Cl. .......................... 336/96; 336/192; 336/229; 336/90

(58) Field of Classification Search .................. None
See application file for complete search history.

(56) References Cited

U.S. PATENT DOCUMENTS

| 3,353,124 | A | | 11/1967 | Dilger |
| 3,721,747 | A | * | 3/1973 | Renskers ................... 174/532 |
| 4,789,847 | A | | 12/1988 | Sakamoto et al. |
| 4,930,200 | A | | 6/1990 | Brush, Jr. et al. |
| 5,069,641 | A | | 12/1991 | Sakamoto et al. |
| 5,212,345 | A | * | 5/1993 | Gutierrez ................... 174/556 |
| 5,277,625 | A | | 1/1994 | Iannella et al. |
| 5,309,130 | A | | 5/1994 | Lint |
| 5,321,372 | A | | 6/1994 | Smith |
| 5,337,028 | A | | 8/1994 | White |
| 5,587,884 | A | | 12/1996 | Raman |
| 5,805,431 | A | | 9/1998 | Joshi et al. |
| 6,116,963 | A | | 9/2000 | Shutter |
| 6,769,936 | B2 | | 8/2004 | Gutierrez et al. |

FOREIGN PATENT DOCUMENTS

JP 07161535 * 6/1995

OTHER PUBLICATIONS

Harold Tischler, "Mounting and Packaging Techniques for Toroidal Devices", Proceedings of Electrical Electronics Insulation Conference and Electrical Manufacturing & Coil Winding Conference, Oct. 1993, pp. 261–262.*
Brad J. McCormick et al., "Surface Mount Transformers: A New Packaging Approach", Surface Mount Technology, Feb. 1993, pp. 27–31.*
Nano Pulse Industries, Catalog page for SMD 10BaseT Transformers, Jun. 1994.*
Nano Pulse Industries, Catalog page for Ethernet Isolation Transformers, Jun. 1994.*

(Continued)

*Primary Examiner*—Tuan H Nguyen

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking. A reinforcement beam is located laterally across the bottom of the package to provide mechanical strength for the case.

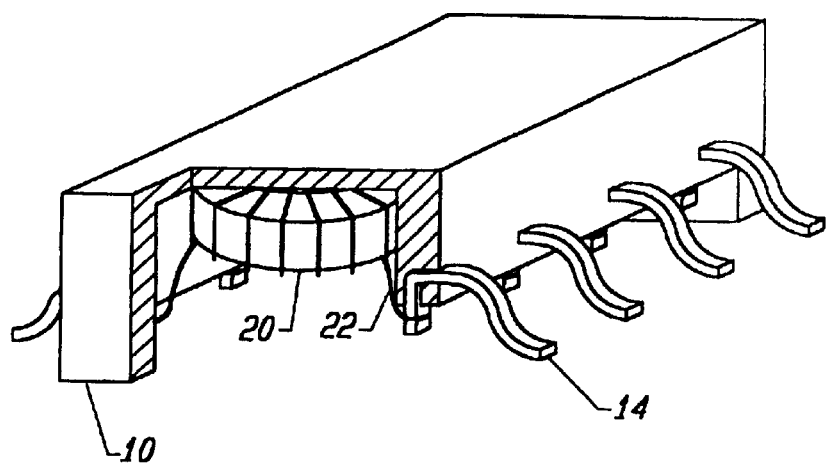

OTHER PUBLICATIONS

Defendant Technitrol, Inc.'s First Supplemental Answers to Plaintiff Halo Electronics, Inc.'s First Set of Interrogatories, dated Jul. 4, 2009 (6 pages).

Defendant Pulse Engineering, Inc.'s First Supplemental Answers to Plaintiff Halo Electronics, Inc.'s First Set of Interrogatories, dated Jul. 4, 2009 (5 pages).

Plaintiff Halo Electronics, Inc.'s Responses to Defendant Pulse Engineering, Inc. and Defendant Technitrol, Inc.'s First Set of Interrogatories—Exhibit 11A—Preliminary Claim Chart for USPN 5,656,985, dated Jul. 13, 2009 (6 pages).

Plaintiff Halo Electronics, Inc.'s Responses to Defendant Pulse Engineering, Inc. and Defendant Technitrol, Inc.'s First Set of Interrogatories—Exhibit 11B—Preliminary Claim Chart for USPN 6,297,720, dated Jul. 13, 2009 (7 pages).

Plaintiff Halo Electronics, Inc.'s Responses to Defendant Pulse Engineering, Inc. and Defendant Technitrol, Inc.'s First Set of Interrogatories—Exhibit 11C—Preliminary Claim Chart for USPN 6,297,721, dated Jul. 13, 2009 (6 pages).

Plaintiff Halo Electronics, Inc.'s Responses to Defendant Pulse Engineering, Inc. and Defendant Technitrol, Inc.'s First Set of Interrogatories—Exhibit 11D—Preliminary Claim Chart for USPN 6,320,489, dated Jul. 13, 2009 (9 pages).

Plaintiff Halo Electronics, Inc.'s Responses to Defendant Pulse Engineering, Inc. and Defendant Technitrol, Inc.'s First Set of Interrogatories—Exhibit 11E—Preliminary Claim Chart for USPN 6,344,785, dated Jul. 13, 2009 (11 pages).

Plaintiff Halo Electronics, Inc.'s Responses to Defendant Pulse Engineering, Inc. and Defendant Technitrol, Inc.'s First Set of Interrogatories—Exhibit 11F—Preliminary Claim Chart for USPN 6,662,431, dated Jul. 13, 2009 (3 pages).

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–8 is confirmed.

New claims 9–20 are added and determined to be patentable.

9. *An electronic surface mount package for mounting onto the surface of a printed circuit board comprising:*
   *a construction package having a first side wall and an open bottom,*
   *a plurality of toroid transformers within said package in a soft silicone material, said toroid transformers each having wires wound thereon,*
   *a plurality of terminal pins molded within the first side wall of said package, the ends of the pins forming solder posts extending through and below the bottom of said first side wall, said solder posts each having a notched post upon which said wires from said transformers are wrapped and soldered thereon, respectively, wherein each of said solder posts is substantially parallel to the first side wall, and a portion of each of the pins extends from and is substantially perpendicular to the first side wall, each of the pins further including a lead for mounting onto the surface of the printed circuit board,*
   *an end wall substantially perpendicular to the first side wall, wherein at least a portion of the end wall extends below said solder posts, and*
   *a second side wall substantially parallel to the first side wall, and wherein said wires from said transformers are contained between first and second planes defined, respectively, by an outside surface of said first side wall and an outside surface of said second side wall.*

10. *The package of claim 9, wherein said portion of the end wall that extends below said solder posts includes a central section of a lower surface of the end wall.*

11. *The package of claim 9, wherein each of the terminal pins has a nonlinear portion disposed within the first side wall, and the nonlinear portion includes a first segment and a second segment substantially perpendicular to the first segment.*

12. *An electronic surface mount package for mounting onto the surface of a printed circuit board comprising:*
   *a construction package having a first side wall and an open bottom,*
   *a plurality of toroid transformers within said package in a soft silicone material, said toroid transformers each having wires wound thereon,*
   *a plurality of terminal pins molded within the first side wall of said package, the ends of the pins forming solder posts extending through and below the bottom of said first side wall, said solder posts each having a notched post upon which said wires from said transformers are wrapped and soldered thereon, respectively, wherein each of said solder posts is substantially parallel to the first side wall, and a portion of each of the pins extends from and is substantially perpendicular to the first side wall, each of the pins further including a lead for mounting onto the surface of the printed circuit board, and*
   *a second side wall substantially parallel to the first side wall, and wherein said wires from said transformers are contained between first and second planes defined, respectively, by an outside surface of said first side wall and an outside surface of said second side wall.*

13. *The package of claim 12, wherein each of the terminal pins has a nonlinear portion disposed within the first side wall, and the nonlinear portion includes a first segment and a second segment substantially perpendicular to the first segment.*

14. *An electronic surface mount package for mounting onto the surface of a printed circuit board comprising:*
   *an open construction package having a first side wall,*
   *at least one toroid transformer within said package in a soft silicone material, said toroid transformer having a wire wound thereon,*
   *at least one terminal pin molded within the first side wall of said package, said one end forming a solder post extending through and below the bottom of said first side wall said solder post having a notched post upon which said wire from said transformer is wrapped and soldered thereon, wherein said solder post is substantially parallel to the first side wall, and a portion of the terminal pin extends from and is substantially perpendicular to the first side wall, the terminal pin further including a lead for mounting onto the surface of the printed circuit board,*
   *an end wall substantially perpendicular to the first side wall, wherein at least a portion of the end wall extends below said solder post, and*
   *a second side wall substantially parallel to the first side wall, and wherein said wire from said transformer is contained between first and second planes defined, respectively, by an outside surface of said first side wall and an outside surface of said second side wall.*

15. *The package of claim 14, wherein said portion of the end wall that extends below said solder posts includes a central section of a lower surface of the end wall.*

16. *The package of claim 14, wherein the terminal pin has a nonlinear portion disposed within the first side wall, and the nonlinear portion includes a first segment and a second segment substantially perpendicular to the first segment.*

17. *The package of claim 14, wherein the package has an open bottom.*

18. *An electronic surface mount package for mounting onto the surface of a printed circuit board comprising:*
   *an open construction package having a first side wall,*
   *at least one toroid transformer within said package in a soft silicone material, said toroid transformer having a wire wound thereon,*
   *at least one terminal pin molded within the first side wall of said package, said one end forming a solder post extending through and below the bottom of said first side wall said solder post having a notched post upon which said wire from said transformer is wrapped and soldered thereon, wherein said solder post is substantially parallel to the first side wall, and a portion of the* terminal pin extends from and is substantially perpendicular to the first side wall, the terminal pin further including a lead for mounting onto the surface of the printed circuit board, and a second side wall substantially parallel to the first side wall, and wherein said wire from said transformer is contained between first and second planes defined, respectively, by an outside surface of said first side wall and an outside surface of said second side wall.

19. The package of claim 18, wherein the terminal pin has a nonlinear portion disposed within the first side wall, and the nonlinear portion includes a first segment and a second segment substantially perpendicular to the first segment.

20. The package of claim 18, wherein the package has an open bottom.

\* \* \* \* \*